United States Patent [19]

Okamura

[11] Patent Number: 5,740,120
[45] Date of Patent: Apr. 14, 1998

[54] SEMICONDUCTOR MEMORY HAVING IMPROVED DATA BUS ARRANGEMENT

[75] Inventor: Junichi Okamura, Kanagawa-ken, Japan

[73] Assignee: Kabushiki Kaisha Toshiba, Tokyo, Japan

[21] Appl. No.: 582,675

[22] Filed: Jan. 4, 1996

[30] Foreign Application Priority Data

Jan. 5, 1995 [JP] Japan .................................. 7-000128

[51] Int. Cl.$^6$ .............................. G11C 8/00; G11C 7/00
[52] U.S. Cl. ............................. 365/230.03; 365/230.08; 365/189.05
[58] Field of Search ........................ 365/230.03, 230.08, 365/189.05

[56] References Cited

U.S. PATENT DOCUMENTS

| | | | |
|---|---|---|---|
| 5,303,192 | 4/1994 | Baba | 365/200 |
| 5,412,613 | 5/1995 | Galbi et al. | 365/230.03 |
| 5,416,741 | 5/1995 | Ohsawa | 365/200 |
| 5,444,305 | 8/1995 | Matsui | 365/230.03 |
| 5,491,664 | 2/1996 | Phelan | 365/200 |
| 5,499,215 | 3/1996 | Hatta | 365/230.03 |
| 5,502,675 | 3/1996 | Kohno et al. | 365/200 |

*Primary Examiner*—David C. Nelms
*Assistant Examiner*—Trong Quang Phan
*Attorney, Agent, or Firm*—Loeb & Loeb LLP

[57] ABSTRACT

A semiconductor memory including first, second, and third data busses, and first and second memory cell arrays arranged among the first, second, and third data busses. During operation of the semiconductor memory, a first, a second, and a third switch circuit selectively couple the first, second, and third data busses to a fourth and a fifth data bus. Additionally, there is provided first and second buffer circuits, which are respectively coupled to the fourth and the fifth data busses, and a sixth data bus, which is commonly coupled to the first and second buffer circuits. A control circuit is used to control the operation of the switch circuits. In a preferred embodiment, the semiconductor memory has an equal number of buffer circuits and memory cell arrays.

23 Claims, 11 Drawing Sheets

SEMICONDUCTOR MEMORY HAVING IMPROVED DATA BUS ARRANGEMENT

FIELD OF THE INVENTION

The present invention relates to a semiconductor memory, and more specifically to an arrangement and connecting relationship of data busses and buffer circuits in the core portions of a DRAM (dynamic-type random access memory).

BACKGROUND OF THE INVENTION

In this specification, it is assumed that the circuits are operating under positive logic. Specifically, an "H" level signal is equal to logic 1, which is approximately the internal power source potential Vcc (or at least a voltage high enough to turn a transistor on when applied to its gate if the potential at its source is approximately the ground potential Vss). An "L" level signal is equal to logic 0, which is approximately the ground potential Vss.

Figure 11:
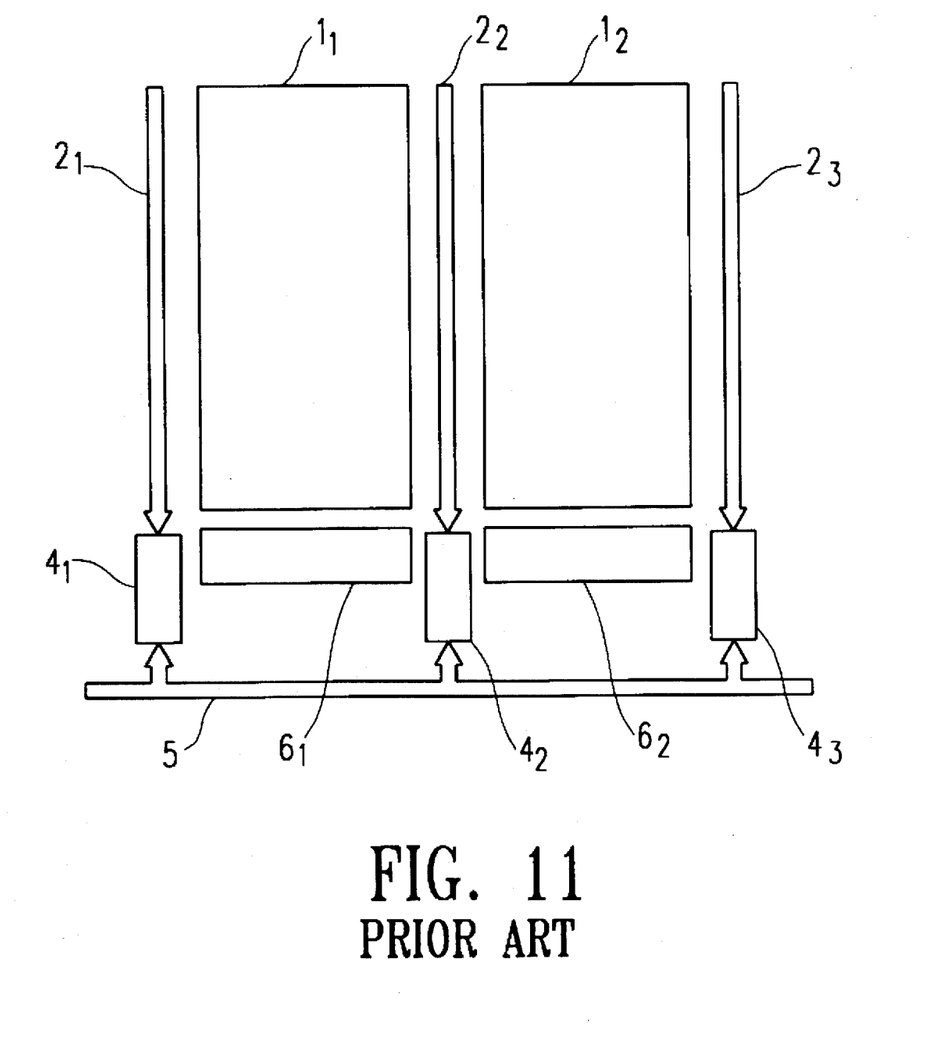
FIG. 11 is a structural view of a circuit showing the arrangement and connecting relationship of data busses and buffer circuits in a conventional semiconductor memory.

FIG. 11 shows an outline of the arrangement of memory cell arrays, data busses and buffer circuits and their connecting relationship in a conventional DRAM. The conventional DRAM includes memory cell arrays 1-1 and 1-2, data busses 2-1, 2-2 and 2-3 (hereinafter, DQ lines), buffer circuits 4-1, 4-2 and 4-3 (hereinafter, DQ buffers), a data bus 5 (hereinafter, main data bus or RWD line), and row decode circuits 6-1 and 6-2.

As is apparent from FIG. 11, the DQ buffers 4 are arranged adjacent to their respective DQ lines 2 and are located between the row decode circuits 6. It is also necessary to arrange many other circuit elements among the row decode circuits 6 which are located adjacent to the outlets of the DQ lines 2. For example, pre-decode circuits, circuits driving bit line equalizing circuits, circuits driving sense amplifier circuits, redundancy fuse circuits, and sense amplifier bit line connecting switch control circuits (hereinafter, φT control circuits) must be so arranged in a DRAM having a shared sense amplifier structure. However, arranging all of these circuit elements causes the spaces between the row decode circuits 6 to become very crowded. In many cases, the pitch among the memory cell arrays must be increased to remedy this problem. Additionally, the number of the DQ buffers required in a conventional DRAM is one more than the number of memory cell arrays. Furthermore, it is also necessary to devise a control for these circuit elements.

Thus, in a conventional semiconductor memory, the arrangement and connecting relationship of data busses and buffer circuits makes it difficult to reduce the chip area; more buffer circuits are necessary than the number of memory cell arrays, and the control of these circuits is difficult.

SUMMARY OF THE INVENTION

In view of these problems, it is the object of the present invention to remove the above-mentioned drawbacks and to provide a semiconductor memory wherein the number of buffer circuits is equal to the number of memory cell arrays and control is facilitated while chip area is reduced.

According to the present invention, data can be supplied to the first and the second buffer circuits via switches and data busses by newly arranging a first, a second and a third switch circuit and a fourth and a fifth data bus in addition to those in the conventional example. Here, the fourth and fifth data busses are arranged orthogonally to the first, second, and third data busses and extend in the row direction at the ends of the memory cell arrays. Therefore, the buffer circuits can be arranged at the ends of the memory cell arrays and it is not necessary to arrange them at the outlets of the first, second, and third data busses. In operation, when the control circuit selects the first memory cell array, the circuit controls the first switch circuit to couple the first data bus to the fourth data bus, and at the same time controls the second switch circuit to couple the second data bus to the fifth data bus. Similarly, when the control circuit selects the second memory cell array, the circuit controls the second switch circuit to couple the second data bus to the fourth data bus, and at the same time controls the third switch circuit to couple the third data bus to the fifth data bus. Hence, it is possible to have the number of the buffer circuits be equal to the number of memory cell arrays. Accordingly, in the present invention, the number of buffer circuits is equal to the number of memory cell arrays and control is facilitated while chip area is reduced.

DETAILED DESCRIPTION OF THE PREFERRED EMBODIMENTS

The embodiments of the present invention will be described in detail hereinbelow with reference to the attached drawings. Although the present invention can naturally be used in various semiconductor memories (SRAM, EPROM, MROM, etc.), the description will be given for a DRAM because the present invention has a structure preferable to a DRAM as will be explained.

Figure 1:
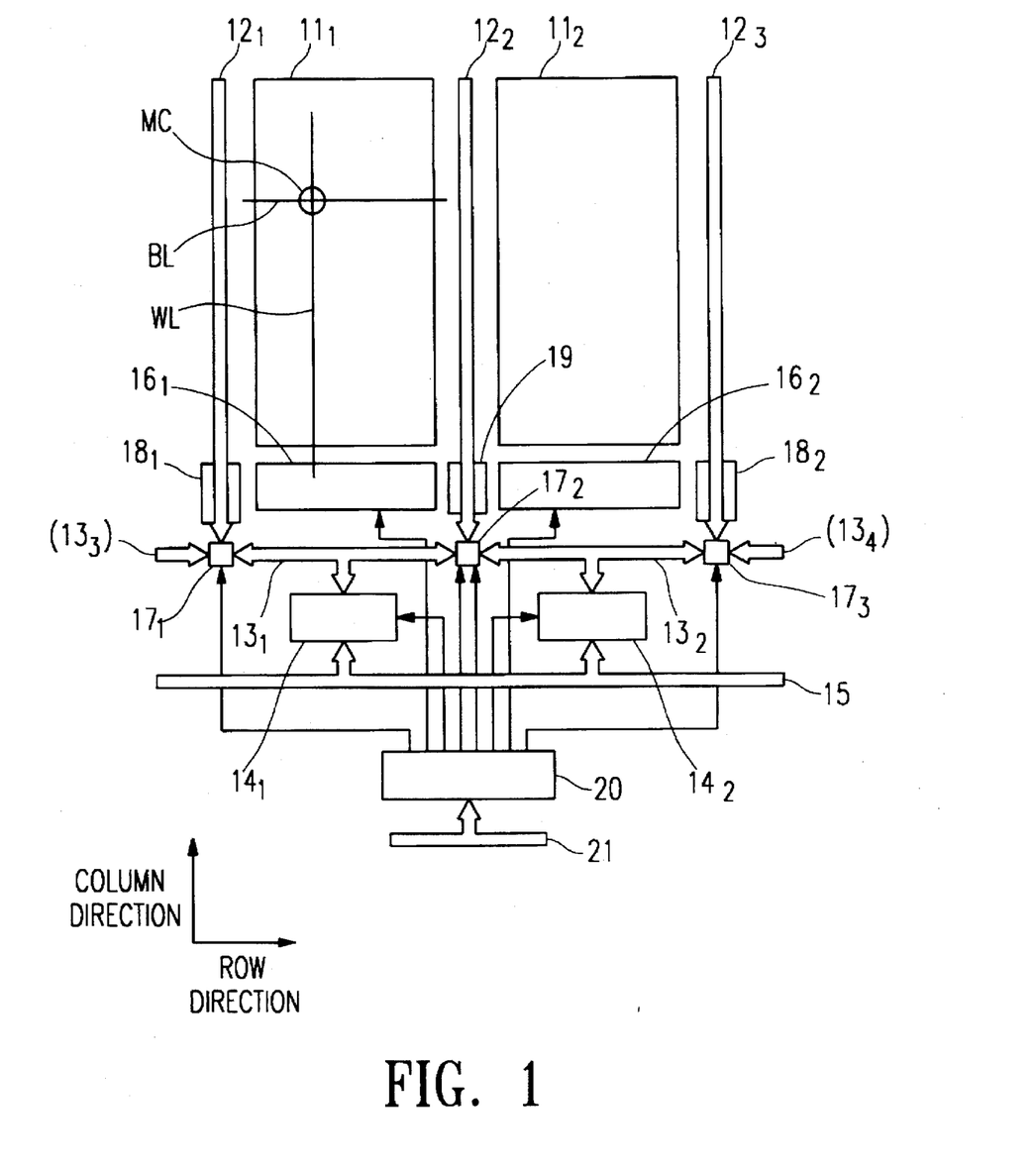
FIG. 1 is a structural view of a circuit showing the essential portions of the present invention.

FIG. 1 shows a circuit diagram showing only essential portions of the present invention. FIG. 1 is an outline view of an embodiment of the present invention showing an arrangement of memory cell arrays, data busses, and buffer circuits and their connecting relationship. This embodiment includes memory cell arrays 11-1 and 11-2, data busses 12-1, 12-2 and 12-3 (hereinafter, DQ lines), data busses 13-1, 13-2, 13-3 and 13-4 (hereinafter, DP lines), buffer circuits 14-1 and 14-2 (hereinafter, DQ buffers), a data bus 15 (hereinafter, main data bus or RWD line), row decode circuits 16-1 and 16-2, switch circuits 17-1, 17-2 and 17-3, pre-decode circuits and pre-decode line drive circuits 18-1 and 18-2, a redundancy fuse circuit 19, a block control circuit 20, and an address and control signal bus 21.

In the memory cell arrays 11-1 and 11-2, dynamic-type memory cells MC composed of one transistor and one capacitor are arranged in a matrix. Memory cells belonging to the same column are coupled to the same pair of bit lines BL, which extend in the row direction, and memory cells belonging to the same row are coupled to the same word line WL, which extends in the column direction. The memory cell arrays are of a shared sense amplifier structure so peripheral circuits, such as sense amplifiers, are arranged at both ends (in the row direction) of a memory cell array. The sense amplifiers, column select transistors, etc. are arranged between the memory cell arrays 11-1 and 11-2 and are commonly used by both of them.

The DQ lines 12 each consist of four pairs of wirings (eight wirings total) extending in the column direction and are arranged among the memory cell arrays 11. The DQ lines (along with the DP lines) transmit data read from the memory cells to the DQ buffers via pairs of bit lines BL and sense amplifiers, not shown, and similarly transfer write data from the DQ buffers to the memory cell arrays. Further, as will be explained, the DQ line 12-1 is commonly used by a memory cell array, not shown, contiguous to the left side (in the row direction) of the figure and the DQ line 12-3 is commonly used by a memory cell array, not shown, contiguous to the right side (in the row direction) of the figure (naturally there is not such a contiguous memory cell array with respect to a memory cell array at the right end or the left end of the core block).

The DP lines 13 each consist of four pairs of wirings (total eight wirings) extending in the row direction and are arranged extending along the ends of the memory cell arrays 11. The DP lines transmit read data from the memory cells (via the bit lines and the DQ lines 12) to the DQ buffers 14 and similarly transmit write data from the DQ buffers to the DQ lines. The DP line 13-3 corresponds to a memory cell array, not shown, contiguous to the left side (in the row direction) of the figure and the DP line 13-4 corresponds to a memory cell array, not shown, contiguous to the right side (in the row direction) of the figure(again, there is not such a contiguous memory cell array and DP line with respect to a memory cell array at the right end or the left end of the core block).

Each DQ buffer 14 is arranger corresponding to a DP line 13 and a memory cell array 11 and is connected to its corresponding DP line 13 and the RWD line 15, which extends in the row direction. The DQ buffers 14 amplify read data supplied by the DP lines 13 and output it to the RWD line 15, and similarly amplify write data supplied by the RWD line 15 and output it to the DP lines 13.

Each row decode circuit 16 is provided corresponding to a memory cell array 11 and drives the word line WL in the memory cell array 11 based on an address signal supplied from the address bus 21. Each of the switch circuits 17 selectively couples the DP lines 13 to the DQ lines 12 under the control of the block control circuit 20. (The specific connections are explained below). The pre-decode circuits and the pre-decode line drive circuits 18 supply pre-decode signals to the adjacent row decode circuits. That is, the row decode circuits 16 are of a partial decode construction and selectively chive the word lines WL based on both the address signal and the pre-decode signals. The redundancy fuse circuit 19 is composed of a fuse array and a comparing circuit for selecting redundancy rows provided in the memory cell array 11 (8 redundancy rows are arranged with respect to 512 rows). The redundancy fuse circuit 19 operates along with the contiguous row decode circuit 16. The block control circuit 20 mainly controls the operations of the switch circuits 17, the DQ buffer circuits 14, and the row decode circuits 16. The control circuit is coupled to the address and control signal bus 21.

Figure 2:
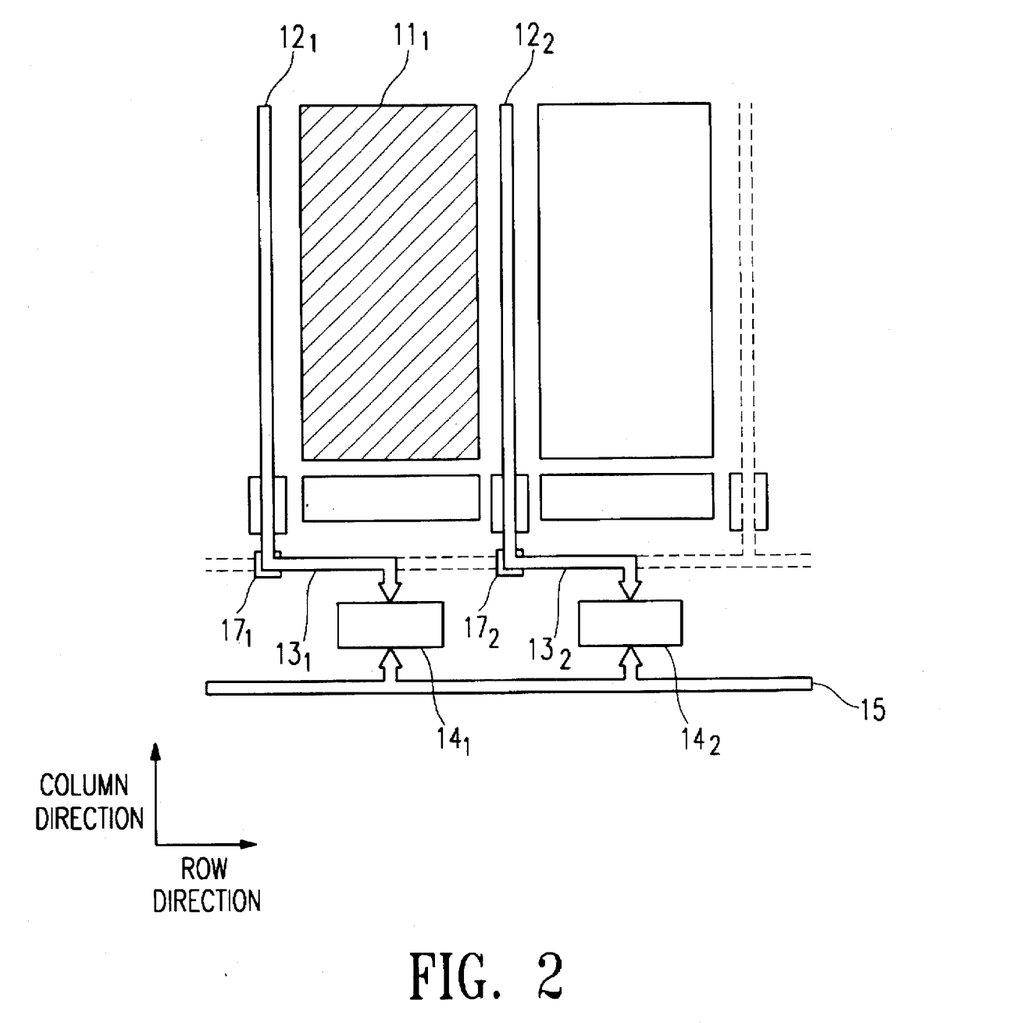
FIG. 2 is a view showing the operation of the circuit shown in FIG. 1.

The operation of the circuits shown in FIG. 1 will now be explained. When, as shown in FIG. 2, memory cells in the first memory cell array 11-1 are selected (that is, when memory cell array 11-1 is selected), the pair of selected bit lines is coupled to the DQ lines 12-1 and 12-2 via column select transistors, not shown. The DQ lines 12-1 and 12-2 on both sides of the selected memory cell array 11-1 are used because the memory cell array is of the shared sense amplifier structure. Additionally, because the memory cell array 11-1 is selected, the switch circuit 17-1 couples the DQ line 12-1 to the DP line 13-1 and the switch circuit 17-2 couples the DQ line 12-2 to the DP line 13-2. As a result, the DQ line 12-1 is coupled to the DQ buffer 14-1 and the DQ line 12-2 is coupled to the DQ buffer 14-2. Thus, in reading data, a very small potential difference between the pair of bit lines (that is, data read from the memory cells) is amplified by a sense amplifier, passes through the DQ lines 12 and the DP lines 13 via the column select transistors, is again amplified by the DQ buffers 14, and is transmitted to the RWD line 15. In writing data, data supplied from the RWD line 15 is amplified by the DQ buffers, passes through the DP lines and the DQ lines, and is transmitted to the pair of selected bit lines via the column select transistors.

Figure 3:
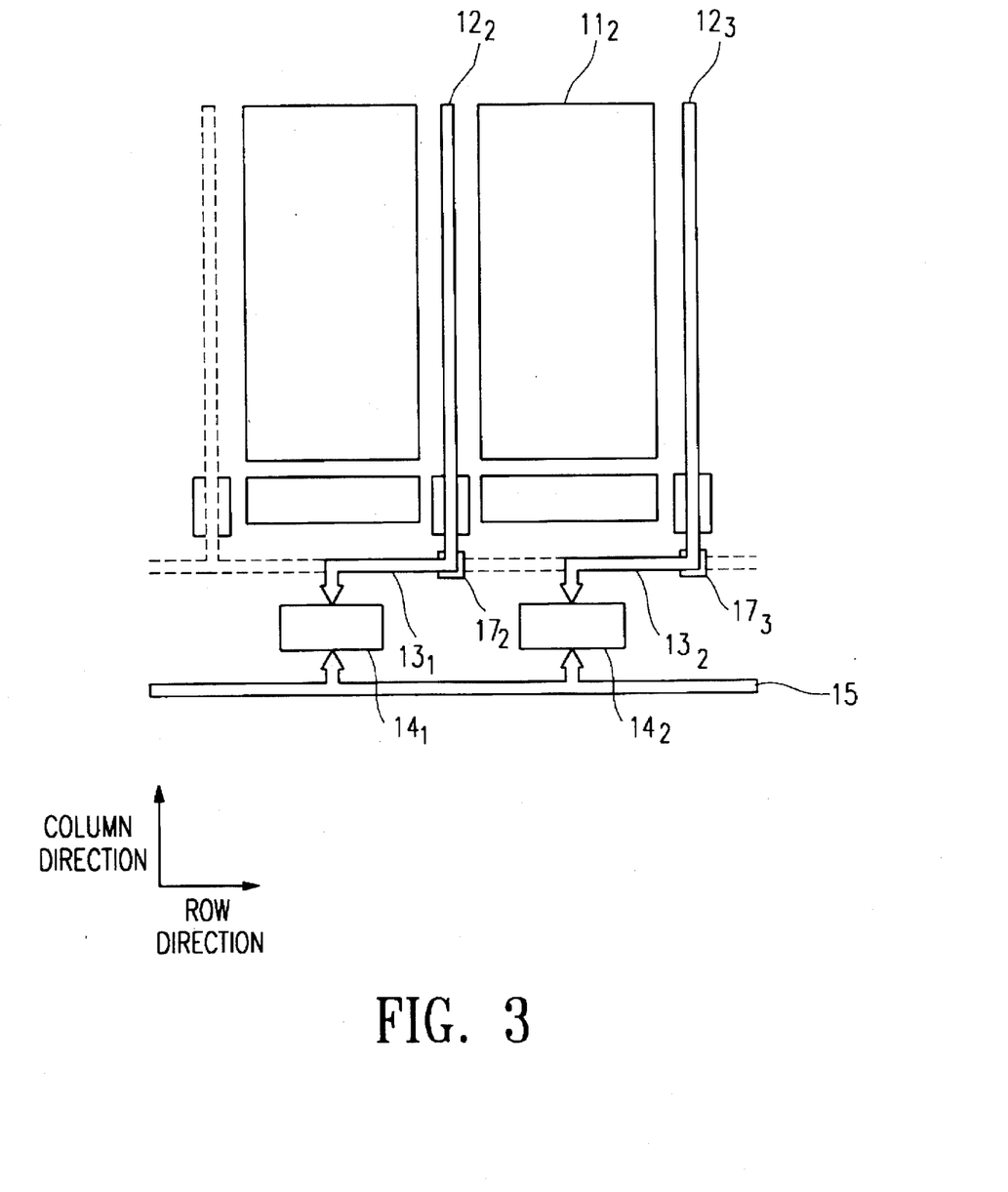
FIG. 3 is another view showing the operation of the circuit shown in FIG. 1.

When, as shown in FIG. 3, memory cells in the second memory cell array 11-2 are selected (that is, when the memory cell array 11-2 is selected), the pair of selected bit lines is coupled to the DQ lines 12-2 and 12-3 via the column select transistors, not shown. Because the memory cell array 11-2 is selected, the switch circuit 17-2 couples the DQ line 12-2 to the DP line 13-1 and the switch circuit 17-3 couples the DQ line 12-3 to the DP line 13-2. As a result, the DQ line 12-2 is coupled to the DQ buffer 14-1 and the DQ line 12-3 is coupled to the DQ buffer 14-2. Thus, in reading data, a very small potential difference between the pair of bit lines (that is, data read from the memory cells) is amplified by a sense amplifier, passes through the DQ lines and the DP lines via the column select transistors, is again amplified by the DQ buffers, and is transmitted to the RWD line 15. In writing data, data supplied from the RWD line 15 is amplified by the DQ buffers, passes through the DP lines and the DQ lines, and is transmitted to the pair of selected bit lines via the column select transistors.

As a result of the design of the present invention, the number of buffer circuits is equal to the number of the memory cell arrays and control is facilitated while area is reduced, as will now be explained.

In the present invention, the degree of freedom with regard to the positioning of the DQ buffers is greatly enhanced due to the newly provided DP lines 13 corresponding to the memory cell arrays. The DP lines make it unnecessary to provide a DQ buffer at the outlet of each DQ line, as is required in conventional DRAM. Therefore, the pitch among the memory cell arrays can be made dense. The design naturally facilitates arrangement of the various peripheral circuits. Additionally, the switch circuits and DP lines are used to prescribe the directions for transmitting data and therefore, the number of DQ buffers can be equal to the number of memory cell arrays. This contributes to a considerable reduction in area in comparison with the conventional case wherein the number of the DQ buffers required is one more than the number of memory cell arrays.

Furthermore, under the conventional circuit structure, control of the circuits (block control) is comparatively complicated because it is necessary to select two of the N+1 DQ buffers and one of the N row decode circuits. However, in the present invention, the number of DQ buffers is equal to the number of row decode circuits and the block control circuit always selects only two of them. Accordingly, the control structure can be much more simplified than in the conventional case.

An explanation will now be given of embodiments of the present invention, including the circuit structure of FIG. 1 and other peripheral potions, in reference to FIGS. 4 through 10.

Figure 4:
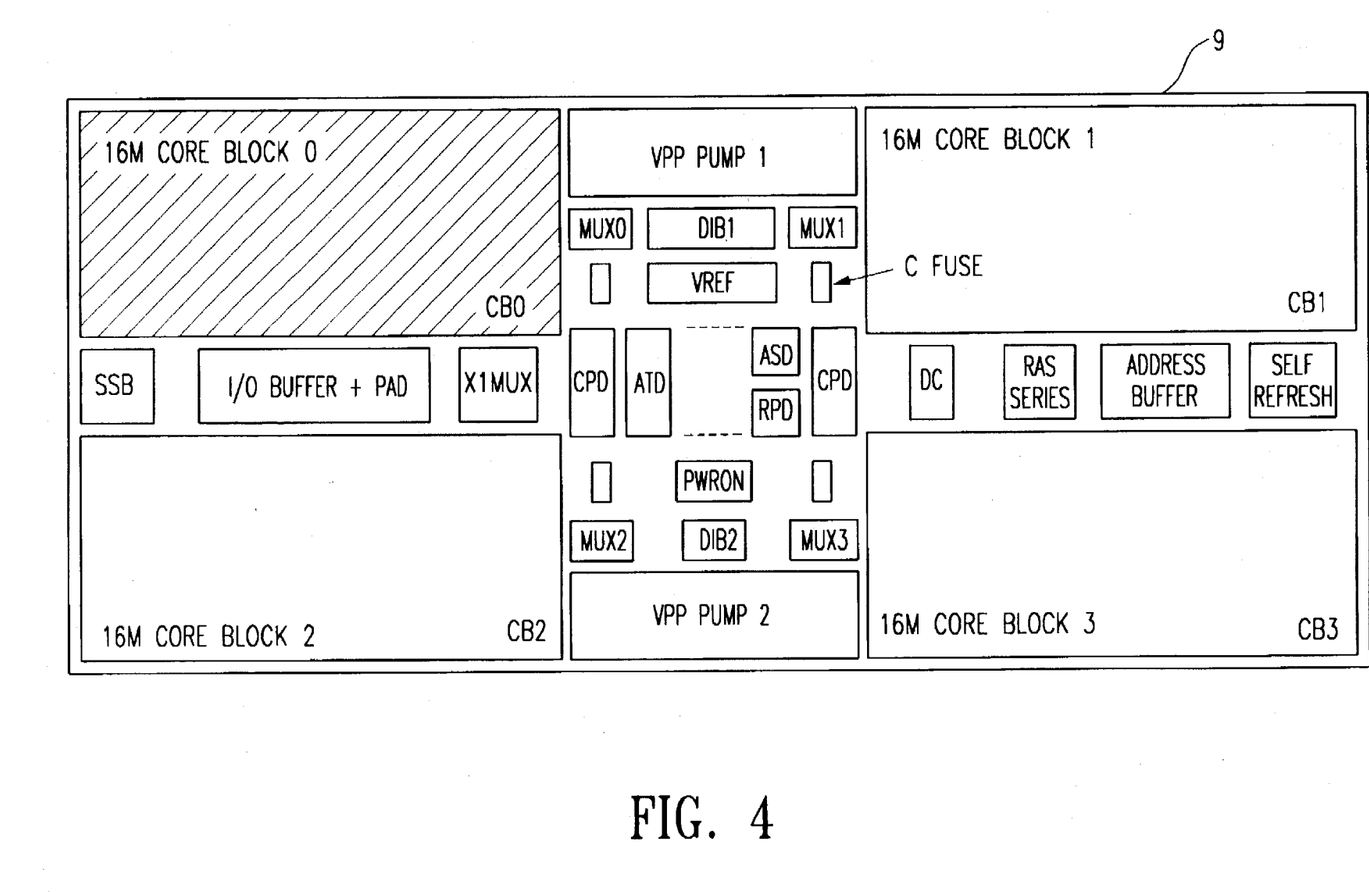
FIG. 4 is a plane view showing an embodiment of the present invention.

FIG. 4 shows an outline structural view of a DRAM of the present invention. The total memory capacity is assumed to be 64 M bits. Core blocks CB0, CB1, CB2 and CB3 are arranged in a semiconductor chip 9. Each core block CB is composed of 16 M bits of memory cells and their peripheral circuits, such as sense amplifiers, decoders and the like. Vpp generating circuits (Vpp Pump1 and Vpp Pump2), for generating a boosted voltage Vpp of a word line, are respectively arranged between CB0 and CB 1, and CB2 and CB3. Data multiplexer circuits (MUX0 through MUX3) and data buffer circuits (DIB1 and DIB2) are arranged at data output units of the core blocks CB. A fuse array CFUSE, for holding replaced data of the column redundancy circuits, is located adjacent to each of the core blocks. A reference potential generating circuit VREF, for generating a reference potential or intermediate potential of ½Vcc, is arranged between CB0 and CB1. A power-on reset circuit PWRON, for generating an initializing signal when the chip is initialized with the power source on, is arranged between CB2 and CB3. A substrate potential generating circuit SSB, a data input/ output buffer (I/O Buffer and Pad), and an I/O data multiplexer circuit X1MUX, for selecting Pad in accordance with data output width, are successively arranged between CB0 and CB2. A self refresh control circuit (Self Refresh), an address buffer (Address Buffer), a row series control circuit (RAS Series), and a data control circuit DC are successively arranged between CB1 and CB3. Additionally, column partial decoder circuits CPD, an address transition detection circuit ATD, a row partial decoder circuit RPD, and a column address switch circuit ASD are arranged at the central potion of the chip 9.

Figure 5:
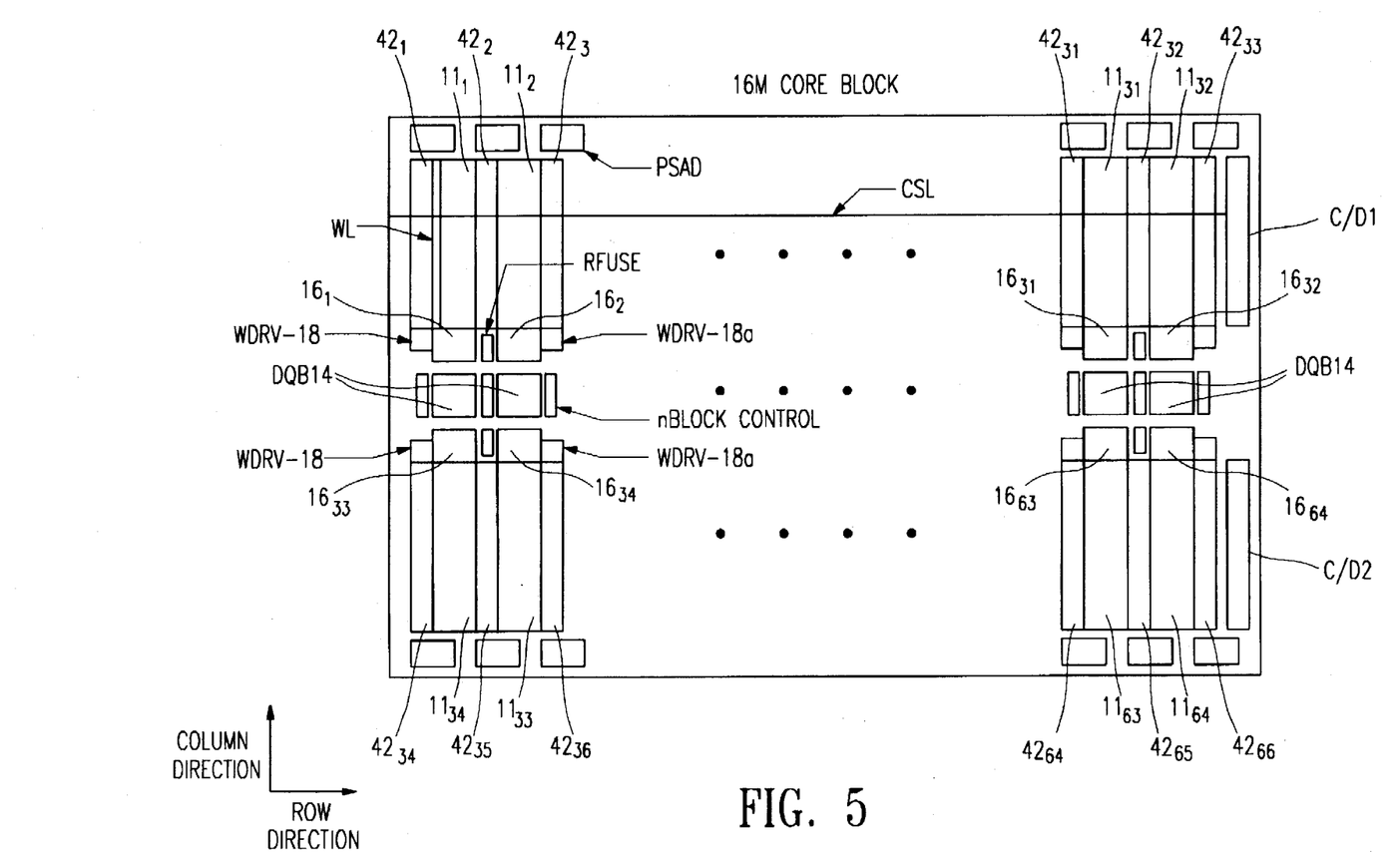
FIG. 5 is a structural diagram showing in detail essential potions of FIG. 4.

FIG. 5 shows the structure of a 16 M bits core block CB. Sixty-four sets of 256 K bit memory cell arrays 11-1 through 11-64 and sixty-six sets of peripheral circuits within the core section 42-1 through 42-66 are alternately arranged to form a memory cell block. Column decoder circuits (C/D1 and C/D2) are arranged at one end of the core block. A plurality of column select lines CSL, which extend in the row direction, are selectively driven by the column decoder circuits C/D. The column select lines CSL supply select signals to the peripheral circuits within the core section 42 at each row belonging to the same column. Specifically, the column select lines are used for partial activation of the sense amplifier circuits and for driving the column gate circuits. The memory cell block is divided into top and bottom groups of memory cell arrays. Between these two groups are arranged row decoder circuits 16-1 through 16-64, for selectively driving word lines WL by internal row address signals (each row decoder circuit corresponds to a memory cell array); drive circuits WDRV 18, for supplying drive signals to the row decoder circuits; fuse circuits RFUSE 19, for holding replaced data of row redundancy circuits; DQ buffers DQB 14; a block control circuit BC; and the like. P-channel type sense amplifier drive circuits PSAD, each corresponding to a peripheral circuit within the core section, are arranged at peripheral portions of the core block CB. These circuits combine to form a 16 M bits core block CB. By arranging the row decoder circuits 16 and the DQ buffers 14 as shown in FIG. 5, it is possible to densely arrange all of the circuit elements and thus provide a large capacity DRAM with a smaller chip area.

Figure 6:
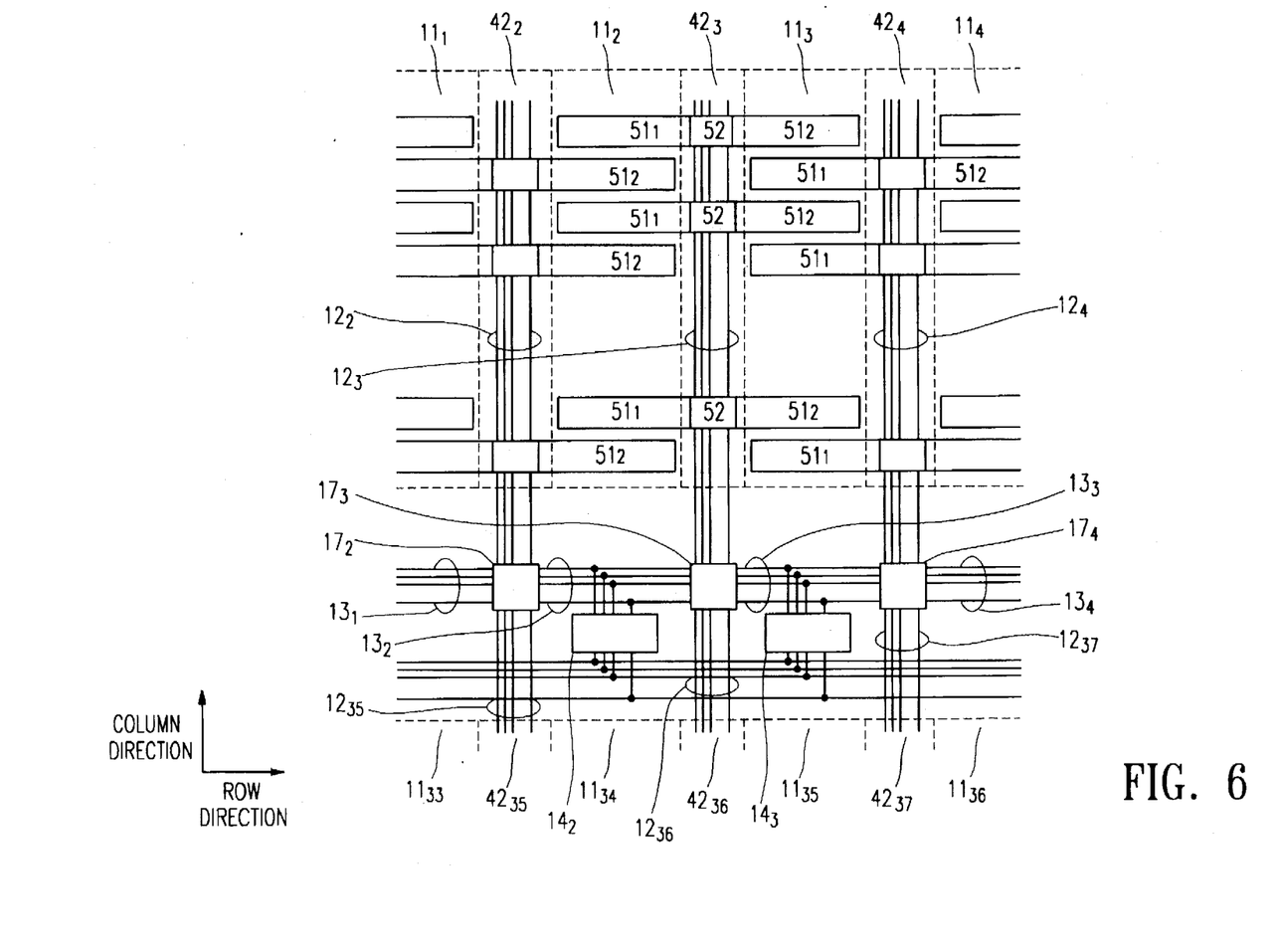
FIG. 6 is a structural diagram showing in more detail the essential portions of FIG. 5.

FIG. 6 shows in detail the internal circuit construction of a region including the memory cell arrays 11-1, 11-2, 11-3, 11-4, 11-33, 11-34, 11-35 and 11-36. The memory cell arrays 11 and the peripheral circuits within the core 42 are alternately arranged and the DQ lines 12 are extended in parallel with each other on the peripheral circuits within the core. The memory cell arrays are of the shared sense amplifier structure and pairs of bit lines (51-1 and 51-2), which are composed of four pairs of bit lines selected by the same column select line CSL, are connected to the left and right of one sense amplifier block 52. In the memory cell array structure, the bit line blocks, each composed of a sense amplifier block 52 and a pair of bit lines 51-1 and 51-2, are positioned in a staggered arrangement. Through this structure, the sense amplifier blocks 52 are continuously arranged in the peripheral circuits within the core section 42 and the group of pairs of bit lines 51-1 and 51-2 are alternately arranged in the memory cell arrays 11. The DQ lines 12 are coupled to the corresponding sense amplifier blocks 52. In this way, although omitted for simplification in FIG. 1, the switch circuits 17 operate as exchange switches to output data from either the top half of the memory cell arrays (11-1 through 11-4) or the bottom half of the memory cell arrays (11-33 through 11-36). Accordingly, the required number of buffer circuits 14 can be halved.

Figure 7:
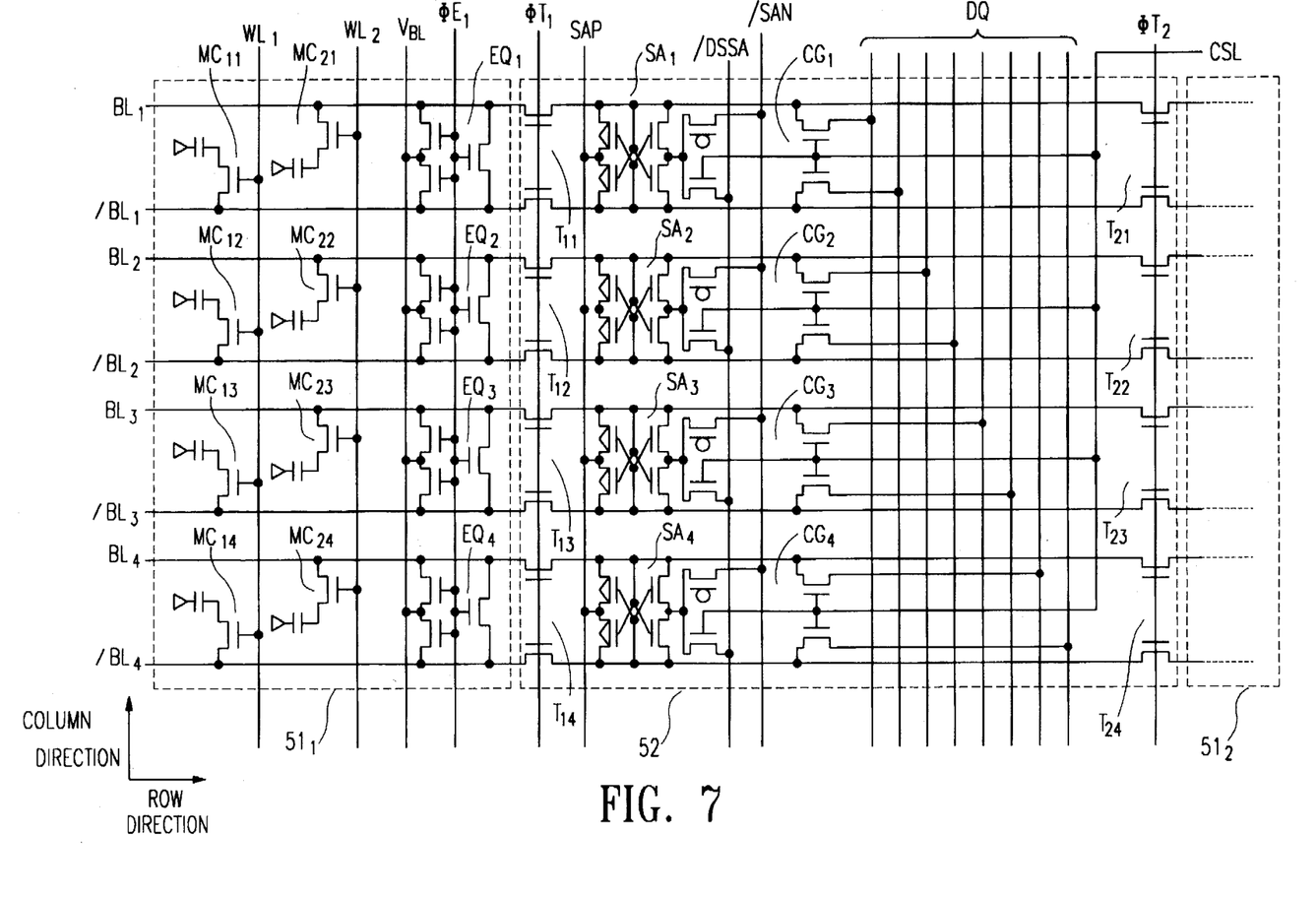
FIG. 7 is a circuit diagram showing in more detail the essential portions of FIG. 6.

FIG. 7 shows in more detail the circuit structure of the left side group of pairs of bit lines 51-1, the sense amplifier block 52, and the right side group of pairs of bit lines 51-2. The left side group of pairs of bit lines 51-1 is composed of four pairs of bit lines (BL1 and/BL1 through BL4 and/BL4) which are coupled to dynamic-type memory cells (MC 11 through MC24) in a matrix. Memory cells (MC 11 through MC 14) are selectively driven by one word line WL1 and memory cells (MC21 through MC24) are selectively driven by another word line WL2. The respective pairs of bit lines are connected to equalization circuits (EQ1 through EQ4) which, when driven by a signal φE1, couple VBL (a constant voltage of ½Vcc) to the pairs of bit lines in an equalizing operation.

The sense amplifier block 52 is composed of sense amplifiers SA1 through SA4 coupled to the respective pairs of bit lines and pairs of column select transistors CG1 through CG4 which are selectively driven by the same column select line CSL. Further, the sense amplifier block 52 includes switch circuits T11 through T14 (driven by the same control signal φT1) for selectively coupling the sense amplifier block 52 to the left side group of pairs of bit lines 51-1, and switch circuits T21 through T24 (driven by a same control signal φT2) for selectively coupling the right side group of pairs of bit lines 51-2 to the sense amplifier block 52. Each sense amplifier SA is composed of a pair of P-channel MOS transistors and a pair of N-channel MOS transistors. The pair of the P-channel MOS transistors is driven by one signal SAP and the pair of N-channel MOS transistors is driven by two other signals/DSSA and/SAN. The reason for separating the/DSSA and/SAN signals is to activate sense amplifiers selected by the column select line CSL at a higher speed. As illustrated, four pairs of DQ lines are present to couple with the respective pairs of bit lines via the column select transistors CG1 through CG4.

As previously explained, the pitch of the sense amplifiers (in the column direction) can be made twice as much as the pitch of the pairs of bit lines by adopting the shared sense amplifier structure. This structure reduces the width of the peripheral circuits within the core section (in the row direction) and the data bus arrangement of the present invention is further enhanced. As a result, the shared sense amplifier structure contributes to a further reduction in chip area by combining it with the data bus arrangement of the present invention.

Figure 8:
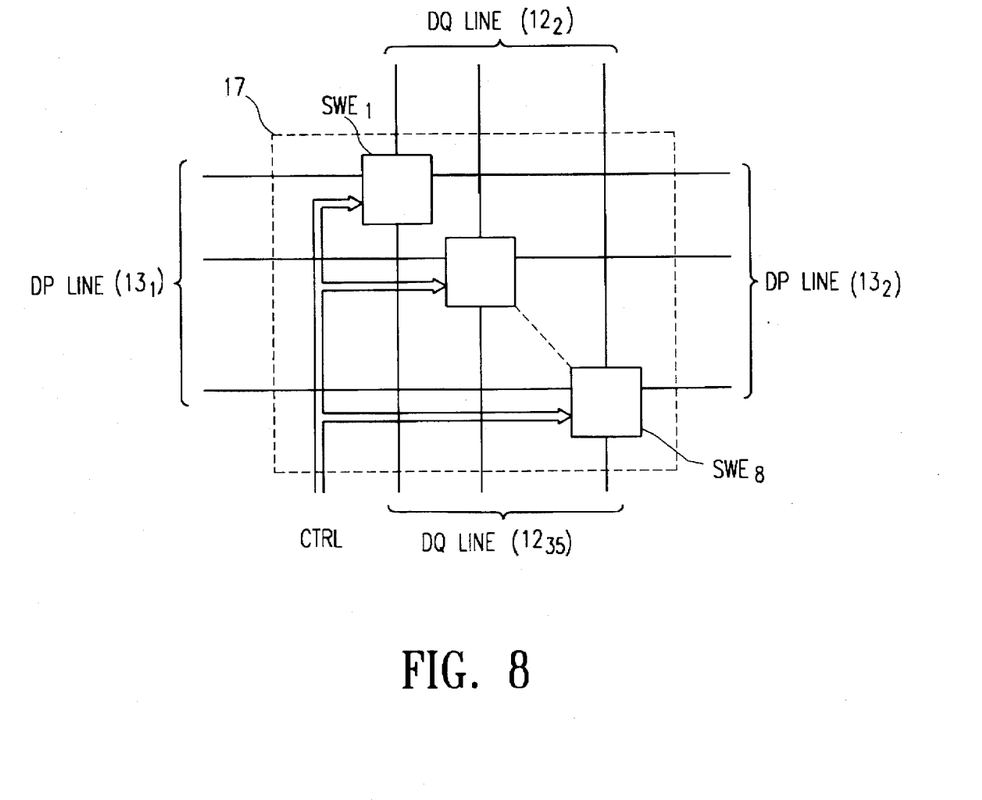
FIG. 8 is a structural view of a circuit showing in more detail other essential portions of FIG. 6.

FIG. 8 shows the internal structure of the switch circuit 17. Bi-directional transmitting switch elements SWE1 through SWE8 are each connected to a top side DQ line (for example, 12-2), a bottom side DQ line (for example, 12-35), a left side DP line (for example, 13-1) and a right side DP line (for example, 13-2). All of the switch elements SWE in a switch circuit 17 are controlled by the same control signals CTRL.

Figure 9:
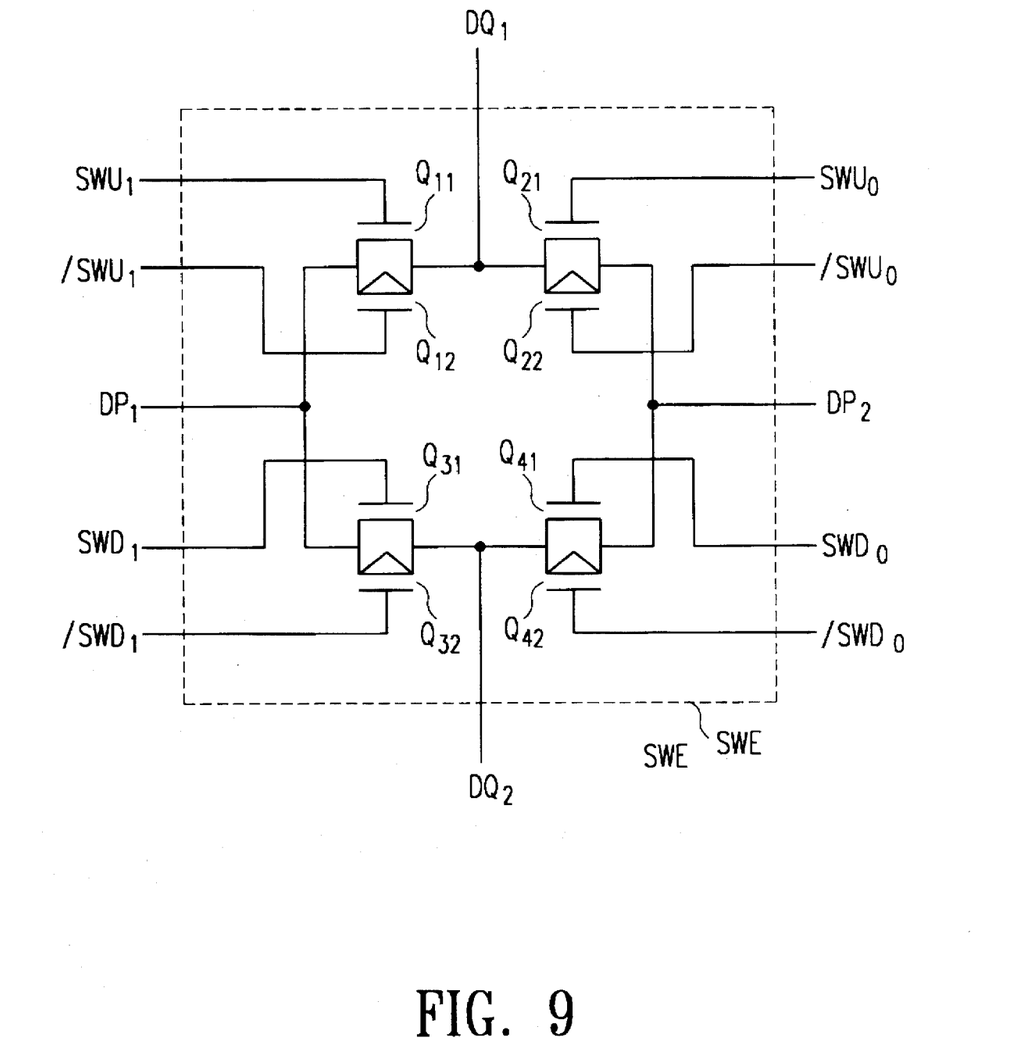
FIG. 9 is a circuit diagram showing in more detail the essential portion of FIG. 8.

FIG. 9 shows in greater detail the internal circuit structure of a switch element SWE. The switch element is composed of N-channel MOS transistors Q11, Q21, Q31 and Q41 and P-channel MOS transistors Q12, Q22, Q32 and Q42. The transistors combine to form four transmit gates, each of which is driven by complementary control signals. Specifically, when signal SWU1 is at "H" level and signal /SWU1 is at "L" level, DQ1 and DP1 are coupled, and when signal SWU0 is at "H" level and signal /SWU0 is at "L" level, DQ1 and DP2 are coupled. Similarly, when signal SWD1 is at "H" level and signal /SWD1 is at "L" level, DQ2 and DP1 are coupled, and when signal SWD0 is at "H" level and signal /SWD0 is at "L" level, DQ2 and DP2 are coupled. The control signals are supplied by the block control circuit 20. Through this design, the number of transistors in a switch circuit is kept low so it is possible to easily arrange the switch circuits between the row decode circuits 6 or at their peripheral portions.

Figure 10:
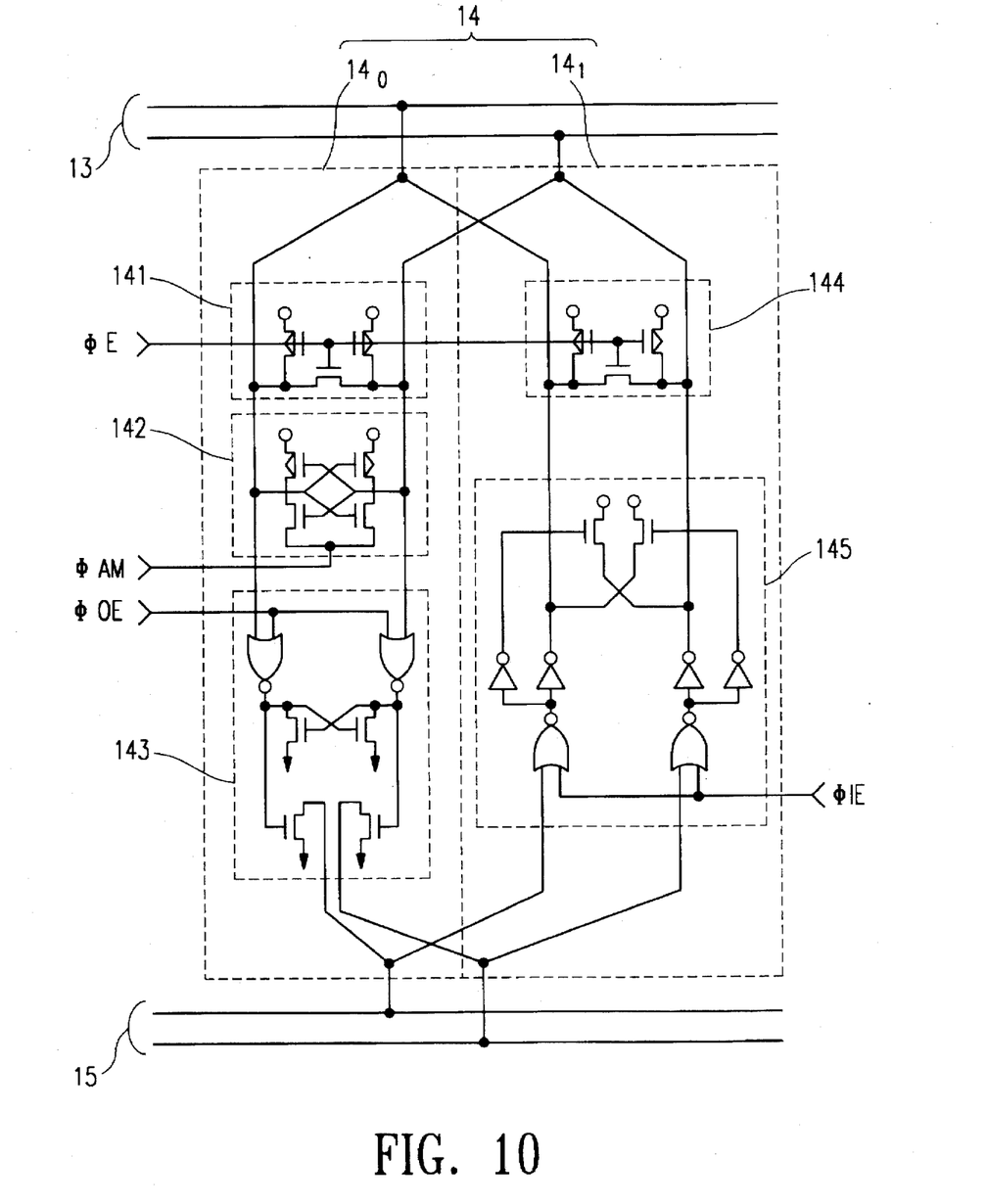
FIG. 10 is a circuit diagram showing in more detail still other essential portions of FIG. 6.

FIG. 10 shows in detail the internal circuit structure of a DQ buffer 14. The DQ buffer 14 is composed of a read unit 14-0 and a write unit 14-1. The read unit 14-0 is composed of an equalization circuit 141 controlled by an equalization signal $\phi E$, a sense unit 142 controlled by a signal $\phi AM$, and an output drive unit 143 controlled by a signal $\phi OE$. The write unit 14-1 is composed of an equalization circuit 144 controlled by the same equalization signal $\phi E$ and a data receive unit 145 controlled by a signal $\phi IE$. Such a multi-stage circuit creates a DQ buffer having high sense sensitivity. When the data bus structure of this embodiment of the present invention is used, it is possible to arrange the DQ buffer at a position other than the outlet of the DQ line. As a result, it is possible to construct a DRAM containing buffers with high speed and high sensitivity.

Naturally, the present invention is not limited to the above-mentioned embodiments and various modifications may be performed without deviating from the gist of the present invention.

As previously explained, the present invention provides a dynamic-type semiconductor memory wherein the number of buffer circuits is equal to the number of memory cell arrays and control is facilitated while chip area is reduced.

What is claimed is:

1. A semiconductor memory, comprising:

a first, a second and a third data bus extending in a column direction;

a first memory cell array having a plurality of memory cells arranged in a matrix, the first memory cell array arranged between the first and the second data busses;

a second memory cell array having a plurality of memory cells arranged in a matrix, the second memory cell array arranged between the second and the third data busses;

a fourth data bus extending in a row direction adjacent to one end of the first memory cell array;

a fifth data bus extending in the row direction adjacent to one end of the second memory cell array;

a first switch circuit for selectively coupling the first data bus to the fourth data bus;

a second switch circuit for selectively coupling the second data bus to either the fourth data bus or the fifth data bus;

a third switch circuit for selectively coupling the third data bus to the fifth data bus; and a control circuit for controlling the first, the second, and the third switch circuits, wherein the control circuit either:

selects the first memory cell array, by controlling the first switch circuit to couple the first data bus to the fourth data bus, and by controlling the second switch circuit to couple the second data bus to the fifth data bus; or selects the second memory cell array, by controlling the second switch circuit to couple the second data bus to the fourth data bus, and by controlling the third switch circuit to couple the third data bus to the fifth data bus.

2. The semiconductor memory according to claim 1, further comprising:

a first buffer circuit coupled to the fourth data bus;

a second buffer circuit coupled to the fifth data bus; and a sixth data bus coupled to both the first and the second buffer circuits.

3. The semiconductor memory according to claim 2, further comprising:

a first sense amplifier circuit group that is located proximate to the first data bus and is selectively coupled to the first data bus;

a second sense amplifier circuit group that is located proximate to the second data bus and is selectively coupled to the second data bus; and a third sense amplifier circuit group that is located proximate to the third data bus and is selectively coupled to the third data bus, wherein the first memory cell array includes a first group of bit lines extending in the row direction, one end of the first group of bit lines being coupled to the first sense amplifier circuit group and the opposite end of the first group of bit lines being coupled to the second sense amplifier circuit group;

the second memory cell array includes a second group of bit lines extending in the row direction, one end of the second group of bit lines being coupled to the second sense amplifier circuit group and the opposite end of the second group of bit lines being coupled to the third sense amplifier circuit group;

the first group of bit lines being coupled to the second sense amplifier circuit group through a first group of transmit gates; and the second group of bit lines being coupled to the second sense amplifier circuit group through a second group of transmit gates.

4. The semiconductor memory according to claim 3, further comprising:

a first row decode circuit for selecting rows of the first memory cell array, the first row decode circuit being arranged between the first memory cell array and the first buffer circuit; and a second row decode circuit for selecting rows of the second memory cell array, the second row decode circuit being arranged between the second memory cell array and the second buffer circuit.

5. The semiconductor memory according to claim 2, wherein each of the first to the fifth data busses has W wirings (W≧1), and each of the first to the third switch circuits has W switch elements for connecting and disconnecting corresponding wirings of the data busses.

6. The semiconductor memory according to claim 5, wherein each of the switch elements has at least two transmit gates.

7. The semiconductor memory according to claim 2, wherein the first buffer circuit has a first read unit for amplifying data on the fourth data bus and outputting the amplified data to the sixth data bus, and a first write unit for transferring data from the sixth data bus to the fourth data bus, and the second buffer circuit has a second read unit for amplifying data on the fifth data bus and outputting the amplified data to the sixth data bus, and a second write unit for transferring data from the sixth data bus to the fifth data bus.

8. The semiconductor memory according to claim 4, wherein each of the first to the fifth data busses has W wirings (W≧1), and each of the first to the third switch circuits has W switch elements for connecting and disconnecting corresponding wirings of the data busses;

each of the switch elements has at least two transmit gates;

the first buffer circuit has a first read unit for amplifying data on the fourth data bus and outputting the amplified data to the sixth data bus, and a first write unit for transferring data from the sixth data bus to the fourth data bus; and the second buffer circuit has a second read unit for amplifying data on the fifth data bus and outputting the amplified data to the sixth data bus, and a second write unit for transferring data from the sixth data bus to the fifth data bus.

9. A semiconductor memory, comprising:

a first, a second and a third data bus extending in a column direction;

a first memory cell array having a plurality of memory cells arranged in a matrix, the first memory cell array arranged between the first and the second data busses;

a second memory cell array having a plurality of memory cells arranged in a matrix, the second memory cell array arranged between the second and the third data busses;

a fourth data bus extending in a row direction adjacent to one end of the first memory cell array;

a fifth data bus extending in the row direction adjacent to one end of the second memory cell array;

a first buffer circuit coupled to the fourth data bus;

a second buffer circuit coupled to the fifth data bus;

a sixth data bus coupled to both the first and the second buffer circuits;

a seventh, an eighth and a ninth data bus extending in the column direction;

a third memory cell array having a plurality of memory cells arranged in a matrix, the third memory cell array arranged between the seventh and the eighth data busses;

a fourth memory cell array having a plurality of memory cells arranged in a matrix, the fourth memory cell array arranged between the eighth and the ninth data busses;

a first switch circuit for selectively coupling either the first data bus to the fourth data bus, or the seventh data bus to the fourth data bus;

a second switch circuit for selectively coupling either the second data bus to the fourth data bus, or the second data bus to the fifth data bus, or the eighth data bus to the fourth data bus, or the eighth data bus to the fifth data bus;

a third switch circuit for selectively coupling either the third data bus to the fifth data bus, or the ninth data bus to the fifth data bus; and a control circuit for controlling the first, the second, and the third switch circuits, wherein the control circuit either:

selects the first memory cell array, by controlling the first switch circuit to couple the first data bus to the fourth data bus, and by controlling the second switch circuit to couple the second data bus to the fifth data bus; or selects the second memory cell array, by controlling the second switch circuit to couple the second data bus to the fourth data bus, and by controlling the third switch circuit to couple the third data bus to the fifth data bus; or selects the third memory cell array, by controlling the first switch circuit to couple the seventh data bus to the fourth data bus, and by controlling the second switch circuit to couple the eighth data bus to the fifth data bus; or selects the fourth memory cell array, by controlling the second switch circuit to couple the eighth data bus to the fourth data bus, and by controlling the third switch circuit to couple the ninth data bus to the fifth data bus.

10. The semiconductor memory according to claim 9, further comprising:

a first sense amplifier circuit group that is located proximate to the first data bus and is selectively coupled to the first data bus;

a second sense amplifier circuit group that is located proximate to the second data bus and is selectively coupled to the second data bus;

a third sense amplifier circuit group that is located proximate to the third data bus and is selectively coupled to the third data bus;

a fourth sense amplifier circuit group that is located proximate to the seventh data bus and is selectively coupled to the seventh data bus;

a fifth sense amplifier circuit group that is located proximate to the eighth data bus and is selectively coupled to the eighth data bus; and a sixth sense amplifier circuit group that is located proximate to the ninth data bus and is selectively coupled to the ninth data bus, wherein the first memory cell array includes a first group of bit lines extending in the row direction, one end of the first group of bit lines being coupled to the first sense amplifier circuit group and the opposite end of the first group of bit lines being coupled to the second sense amplifier circuit group;

the second memory cell array includes a second group of bit lines extending in the row direction, one end of the second group of bit lines being coupled to the second sense amplifier circuit group and the opposite end of the second group of bit lines being coupled to the third sense amplifier circuit group;

the third memory cell array includes a third group of bit lines extending in the row direction, one end of the third group of bit lines being coupled to the fourth sense amplifier circuit group and the opposite end of the third group of bit lines being coupled to the fifth sense amplifier circuit group;

the fourth memory cell array includes a fourth group of bit lines extending in the row direction, one end of the fourth group of bit lines being coupled to the fifth sense amplifier circuit group and the opposite end of the fourth group of bit lines being coupled to the sixth sense amplifier circuit group;

the first group of bit lines is coupled to the second sense amplifier circuit group through a first group of transmit gates;

the second group of bit lines is coupled to the second sense amplifier circuit group through a second group of transmit gates;

the third group of bit lines is coupled to the fifth sense amplifier circuit group through a third group of transmit gates; and the fourth group of bit lines is coupled to the fifth sense amplifier circuit group through a fourth group of transmit gates.

11. The semiconductor memory according to claim 10, further comprising:

a first row decode circuit for selecting rows of the first memory cell array, the first row decode circuit being arranged between the first memory cell array and the first buffer circuit;

a second row decode circuit for selecting rows of the second memory cell array, the second row decode circuit being arranged between the second memory cell array and the second buffer circuit;

a third row decode circuit for selecting rows of the third memory cell array, the third row decode circuit being arranged between the third memory cell array and the first buffer circuit; and a fourth row decode circuit for selecting rows of the fourth memory cell array, the fourth row decode circuit being arranged between the fourth memory cell array and the second buffer circuit.

12. The semiconductor memory according to claim 9, wherein each of the first to the fifth data busses has W wirings (W≧1), each of the seventh to the ninth data busses has W wirings, and each of the first to the third switch circuit has W switch elements for connecting and disconnecting corresponding wirings of the data busses.

13. The semiconductor memory according to claim 12, wherein each of the switch elements has at least four transmit gates.

14. The semiconductor memory according to claim 9, wherein the first buffer circuit has a first read unit for amplifying data on the fourth data bus and outputting the amplified data to the sixth data bus, and a first write unit for transferring data from the sixth data bus to the fourth data bus, and the second buffer circuit has a second read unit for amplifying data on the fifth data bus and outputting the amplified data to the sixth data bus, and a second write unit for transferring data from the sixth data bus to the fifth data bus.

15. The semiconductor memory according to claim 11, wherein each of the first to the fifth data busses has W wirings (W≧1), each of the seventh to the ninth data busses has W wirings, and each of the first to the third switch circuit has W switch elements for connecting and disconnecting corresponding wirings of the data busses;

each of the switch elements has at least four transmit gates;

the first buffer circuit has a first read unit for amplifying data on the fourth data bus and outputting the amplified data to the sixth data bus, and a first write unit for transferring data from the sixth data bus to the fourth data bus; and the second buffer circuit has a second read unit for amplifying data on the fifth data bus and outputting the amplified data to the sixth data bus, and a second write unit for transferring data from the sixth data bus to the fifth data bus.

16. A memory block of the type used in a semiconductor memory, comprising:

N memory cell arrays, each being selectively activated;

N+1 first data busses;

N second data busses, each of the second data busses corresponding to one of the N memory cell arrays; and N+1 switch circuits, each of the switch circuits being adjacent to one of the N+1 first data busses and two of the N second data busses, and operating to selectively couple the adjacent first data bus to one of the adjacent second data busses, wherein the first data busses are arranged alternately with the memory cell arrays.

17. The memory block according to claim 16, further comprising N+1 groups of sense amplifier circuits, each group of sense amplifier circuits corresponding to and arranged with one of the N+1 first data busses.

18. The memory block according to claim 16, further comprising N buffer circuits, each of the buffer circuits adjacent to one of the N second data busses.

19. The memory block according to claim 18, further comprising N+1 groups of sense amplifier circuits, each group of sense amplifier circuits corresponding to and arranged with one of the N+1 first data busses.

20. The memory block according to claim 19, further comprising N row decode circuits, each of the row decode circuits corresponding to one of the N memory cell arrays, wherein the row decode circuits and the buffer circuits are controlled by common select signals.

21. The memory block according to claim 19, further comprising a third data bus arranged in parallel with the second data busses, the third data bus being commonly coupled to the N buffer circuits.

22. The semiconductor memory as defined in claim 1, wherein each of the fourth and fifth data busses is arranged adjacent to one end of its corresponding memory cell array such that the fourth bus does not extend in parallel beside the fifth bus.

23. The memory block as defined in claim 16, wherein each second data bus is arranged adjacent to its corresponding memory cell array such that no two of the second data busses overlap with each other.

* * * * *